United States Patent [19]
Wu

[11] Patent Number: 5,944,398
[45] Date of Patent: Aug. 31, 1999

[54] CASING HAVING RIGHT AND LEFT SIDE PLATES ADAPTED TO COVER RIGHT AND LEFT OPENINGS OF THE CASING WITHOUT USING LOCKING SCREWS

[75] Inventor: Wen-Liang Wu, Tainan Hsien, Taiwan

[73] Assignee: Wei Shun Enterprise Co., Ltd., Tainan, Taiwan

[21] Appl. No.: 09/045,233

[22] Filed: Mar. 20, 1998

[51] Int. Cl.[6] ................................................ H05K 7/18
[52] U.S. Cl. .................... 312/223.2; 312/263; 312/265.3
[58] Field of Search ............................. 312/223.2, 223.1, 312/265.5, 265.6, 265.1, 265.2, 265.3, 265.4, 263, 257.1; 361/724, 683; 220/4.02, 4.28

[56] References Cited

U.S. PATENT DOCUMENTS

| | | | |
|---|---|---|---|
| 1,735,375 | 11/1929 | Card et al. | 312/257.1 |
| 3,360,321 | 12/1967 | Novales | 312/263 X |
| 5,031,070 | 7/1991 | Hsu | 361/683 |
| 5,164,886 | 11/1992 | Chang | 312/257.1 X |
| 5,397,176 | 3/1995 | Allen et al. | 312/223.2 |
| 5,590,938 | 1/1997 | De Andrea | 312/257.1 |
| 5,593,219 | 1/1997 | Ho | 312/263 |

FOREIGN PATENT DOCUMENTS

| | | | |
|---|---|---|---|
| 2323253 | 11/1974 | Germany | 312/223.3 |

Primary Examiner—Janet M. Wilkens
Attorney, Agent, or Firm—Christie, Parker & Hale, LLP

[57] ABSTRACT

A casing includes a hollow rectangular main body with upper and lower walls and front and rear upright walls to define right and left openings, and two pairs of mounting seats fixed to and disposed inboard to the upright walls and extending a longitudinal direction of the upper and lower walls. A retaining member is disposed above the upper wall to define a retaining groove. Each of two side plates has a depressing force transmitting abutment portion extending from an upper edge in a transverse direction thereof, and front and rear lateral abutment portions for abutment with the mounting seats when brought to cover the openings. A cover plate is superimposed on the upper wall, and has a front cover edge and a rear cover edge insertable into the retaining groove. A pair of depressing force actuating abutment portions are disposed under and abut against the depressing force transmitting abutment portions when the rear cover edge is inserted into the retaining groove to superimpose the cover plate on the upper wall. A biasing member biases the cover plate toward the retaining member when the rear cover edge is inserted in the retaining groove. A locking member is disposed on the upper wall to engage the cover plate when the latter is superimposed on the upper wall.

8 Claims, 6 Drawing Sheets

CASING HAVING RIGHT AND LEFT SIDE PLATES ADAPTED TO COVER RIGHT AND LEFT OPENINGS OF THE CASING WITHOUT USING LOCKING SCREWS

FIELD OF THE INVENTION

The invention relates to a casing, more particularly to a casing having right and left side plates for covering right and left openings of the casing with the assistance of a cover plate.

BACKGROUND OF THE INVENTION

Referring to FIGS. 1 and 2, a conventional computer casing is shown to include a rectangular hollow main body 1, two pairs of mounting seats 120, right and left side plates 3, a retaining member 101, three biasing units 21, locking members 100, and a cover plate 2. As illustrated, the main body 1 has elongate upper and bottom walls 10, 11 that are spaced from each other and that have front and rear edges 10A, 11A which define a transverse direction therealong, and right and left lateral edges 10B, 11B which define a longitudinal direction therealong. The main body 1 further has front and rear upright walls 12 interposed between the upper and bottom walls 10, 11 and joined with the front and rear edges 10A, 11A respectively to define right and left openings. The mounting seats 120 are disposed inboard to and extend inwardly from a respective one of the right and left lateral edges 10B, 11B of the upper and bottom walls 10, 11. Each of the left and right side plates 3 is of a dimension to cover the right and left openings, respectively, and has upper and lower edges, a plurality of engaging hooks 300 formed along the upper and lower edges to engage the mounting seats 120 when the side plates 3 are brought to cover the right and left openings, and an upright abutment portion 31 for abutting against the upright lateral portions of the front and rear upright walls 12 when the side plates 3 are at the covered state. The retaining member 101 is disposed above and extends along the transverse direction, and is spaced from the rear edge of the upper wall 10 to define a retaining groove 101A in an upright direction. The cover plate 2 is of a dimension to superimpose on the upper wall 10, and has a front cover edge 2B, a rear cover edge 2A insertable into the retaining groove 101A in the longitudinal direction, and a pair of lateral cover edges 2C. A pair of engagement abutment portions 20 extend along the lateral cover edges 2C to abut against the upper wall 10 when the rear cover edge 2A is inserted into the retaining groove 101A so as to superimpose the cover plate 2 upon the upper wall 10. The biasing units 21 are disposed to bias the rear cover edge 2A of the cover plate 2 toward the retaining member 101 when the rear cover edge 2A is inserted into the retaining groove 101A. The locking members 100 are disposed on the upper wall 10 at positions distal to the rear edge 10A to engage the engagement abutment portions 20 when the cover plate 2 superimposed upon the upper wall 10.

It is noted that, after the side plates 3 are brought from the front side of the main body 1 such that the engaging hooks 300 slide on the mounting seats 120 so as to cover the right and left openings, removal of the side plates 3 in the longitudinal direction is still possible. Therefore, a plurality of locking screws 13 are threaded through the upright abutment portions 31 of the side plates 3 and into the front and rear upright walls 12 in order to prevent removal of the side plates 3 from the main body 1.

SUMMARY OF THE INVENTION

Therefore, the object of this invention is to provide a casing having right and left side plates for covering the right and left openings of the casing with the assistance of a cover plate and without using locking screws.

Accordingly, the casing of this invention includes a rectangular hollow main body, two pairs of mounting seats, right and left side plates, a retaining member, a cover plate, a pair of depressing force actuating abutment portions, a biasing member, a locking member, and strengthening engagement means. The main body has elongate upper and bottom walls that are spaced from each other and that have front and rear edges which define a transverse direction therealong, and right and left lateral edges which define a longitudinal direction therealong. Front and rear upright walls are interposed between the upper and bottom walls and are joined with the front and rear edges respectively. Each of the front and rear upright walls has front right and left lateral edges and rear right and left lateral edges, respectively. The front right and left lateral edges, the rear right and left lateral edges and the right and left lateral edges of the upper and bottom walls cooperatively define right and left openings. The pairs of mounting seats are joined with a first set of the front and rear left lateral edges and a second set of the front and rear right lateral edges, respectively. Each pair of the mounting seats is disposed inboard to and extends from the respective one of the sets of front and rear lateral edges in the longitudinal direction. The side plates are of a dimension to cover the right and left openings, respectively. Each of the side plates has upper and lower edges, and front and rear lateral abutment portions disposed to abut respectively against the mounting seats, when the side plates are brought to cover the right and left openings, and a depressing force transmitting abutment portion extending from the upper edge portion in the transverse direction so as to superimpose upon a respective one of the right and left lateral edges of the upper wall when the right and left side plates are brought to cover the right and left openings. The retaining member is disposed above and extends along the transverse direction, and is spaced from the rear edge of the upper wall to define a retaining groove therebetween in an upright direction along the rear right or left lateral edge of the rear upright wall. The cover plate is of a dimension to superimpose on the upper wall, and has a front cover edge, a rear cover edge insertable into the retaining groove in the longitudinal direction, and a pair of lateral cover edges. The depressing force actuating abutment portions are disposed under and extend along the lateral cover edges to abut against the depressing force transmitting abutment portions when the rear cover edge is inserted into the retaining groove so as to superimpose the cover plate on the upper wall. The biasing member is disposed to bias the rear cover edge of the cover plate toward the retaining member when the rear cover edge is inserted in the retaining groove. The locking member is disposed on the upper wall at a position distal to the rear edge to engage the depressing force actuating abutment portions when the cover plate is superimposed upon the upper wall. The engagement means strengthen the engagement of the lateral abutment portions of the sides plates with the mounting seats as the lateral abutment portions are moved downward relative to the mounting seats when the side plates are brought to cover the right and left openings.

During assembly, the lateral abutment portions of the side plates are brought to abut, via the engagement strengthening means, against the mounting seats and are moved in the upright direction relative to the mounting seats. The subsequent insertion of the rear cover edge of the cover plate into the retaining groove against action of the biasing member, in cooperation with locking action of the locking member upon abutment of the depressing force actuating abutment portions against the depressing force transmitting abutment portion, will urge the depressing force transmitting abutment portions as well as the lateral abutment portions downward so as to further secure the engagement accomplished by the engagement strengthening means.

BRIEF DESCRIPTION OF THE DRAWINGS

Other features and advantages of this invention will become more apparent in the following detailed description of the preferred embodiment of this invention, with reference to the accompanying drawings, in which.

DETAILED DESCRIPTION OF THE PREFERRED EMBODIMENT

Figure 1:
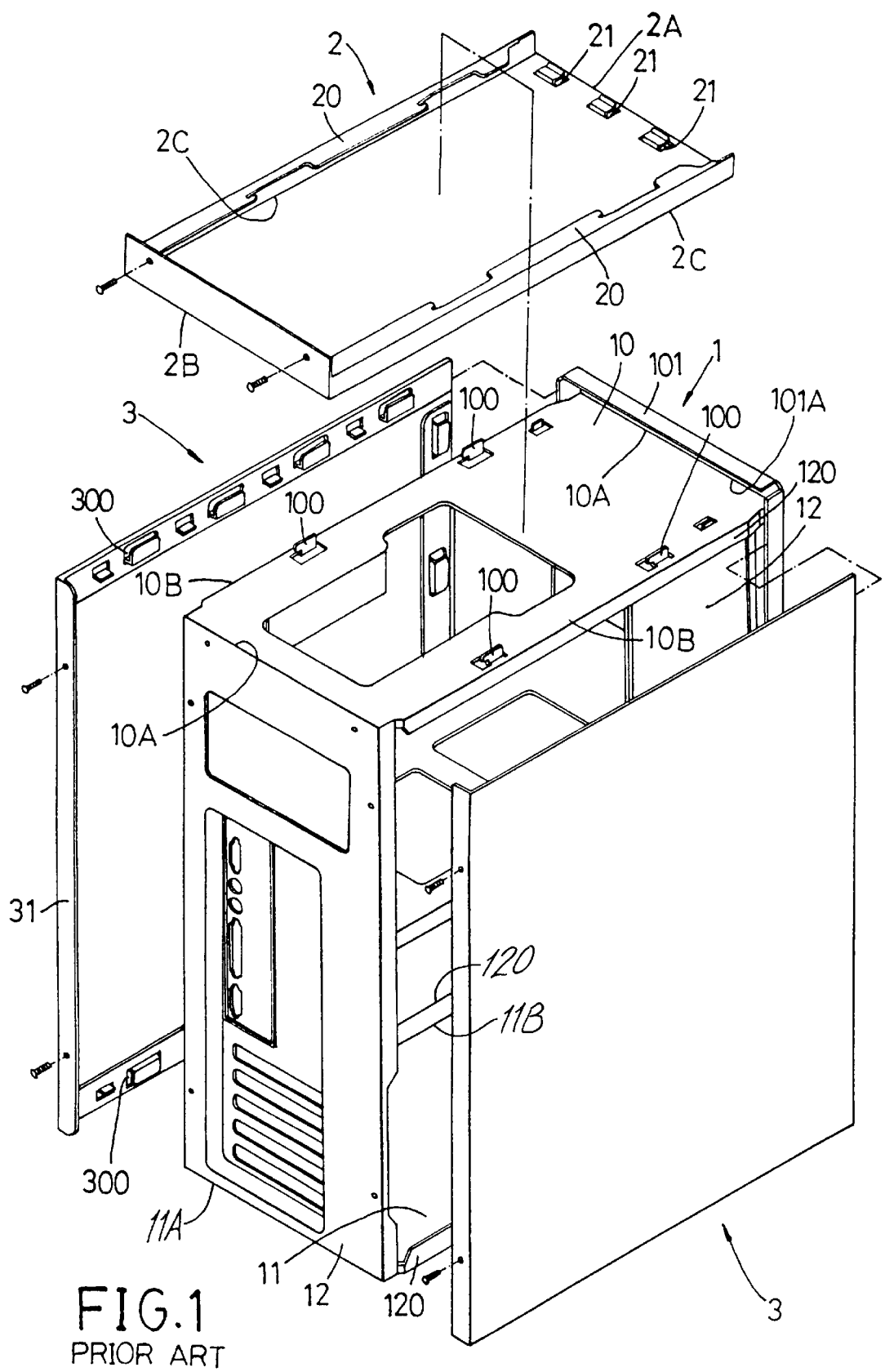
FIG. 1 is an exploded view of a conventional casing.
Figure 2:
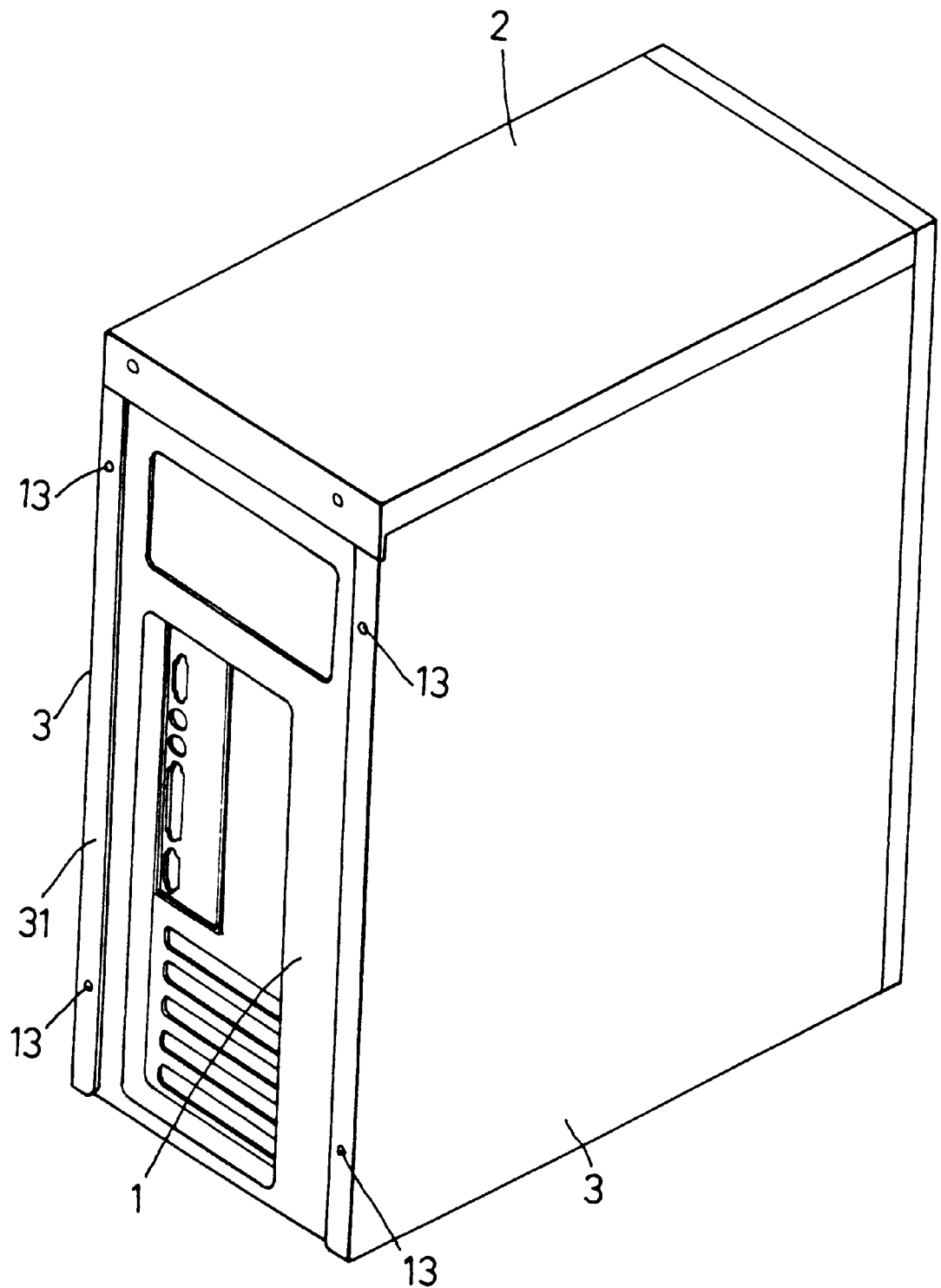
FIG. 2 is a perspective view of the conventional casing.
Figure 3:
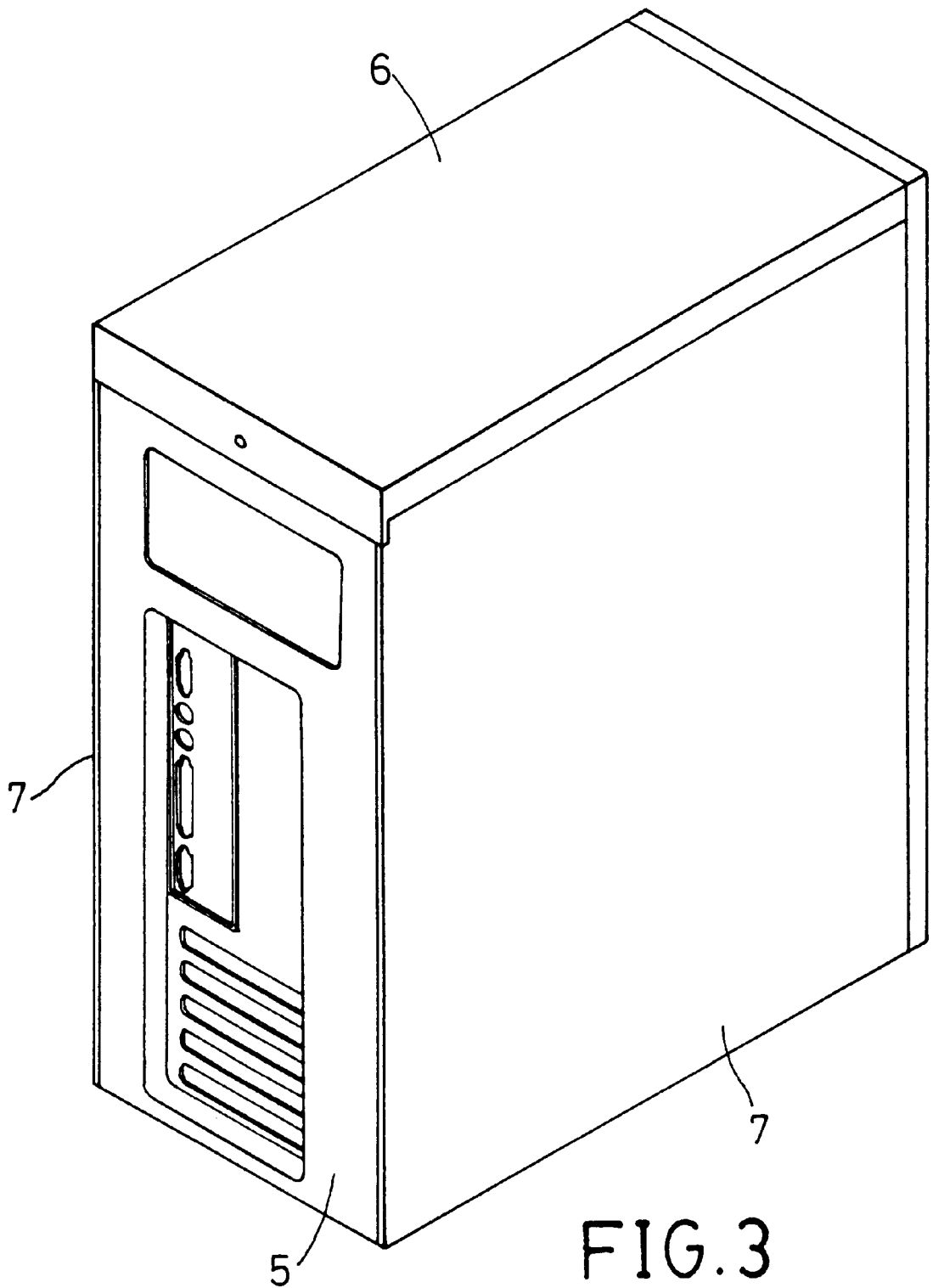
FIG. 3 is a perspective view of a preferred embodiment of a casing of this invention.
Figure 4:
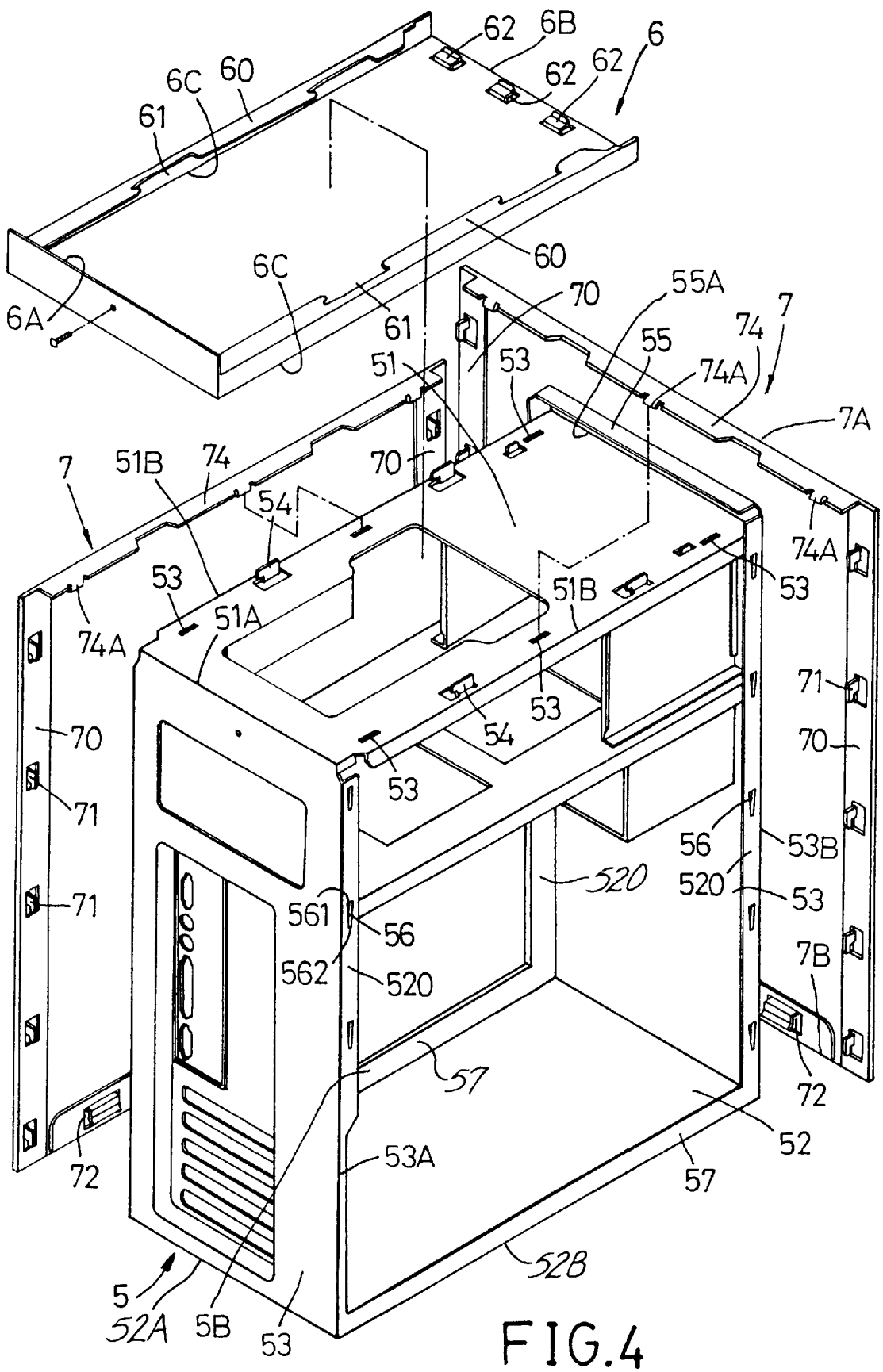
FIG. 4 is an exploded view of the preferred embodiment.

Referring to FIGS. 3 and 4, the preferred embodiment of a computer casing of this invention is shown to include a rectangular hollow main body 5, right and left side plates 7, a retaining member 55, a cover plate 6, a pair of depressing force actuating abutment portions 60, biasing members 62, a locking member, and engagement strengthening means.

As illustrated, the main body 5 has elongate upper and bottom walls 51, 52 that are spaced from each other and that have front and rear edges 51A, 52A which define a transverse direction therealong, and right and left lateral edges 51B, 52B which define a longitudinal direction therealong. Front and rear upright walls 53 are interposed between the upper and bottom walls 51, 52 and are joined with the front and rear edges 51A, 52A thereof, and have front right and left lateral edges 53A and rear right and left lateral edges 53B, respectively. The front right and left lateral edges 53A, the rear right and left lateral edges 53B and the right and left lateral edges 51B, 52B of the upper and bottom walls 51, 52 cooperatively define right and left openings 5B.

Two pairs of mounting seats 520 are joined with a first set of the front and rear left lateral edges 53A, 53B and a second set of the front and rear right lateral edges 53A, 53B, respectively, such that each pair of the mounting seats 520 is disposed inboard to and extends from the respective one of the sets of front and rear lateral edges 53A, 53B in the longitudinal direction.

The side plates 7 are of a dimension to cover the right and left openings 5B, respectively. Each of the side plates 7 has upper and lower edges 7A, 7B, and front and rear lateral abutment portions 70 disposed to abut a respective pair of the mounting seats 520 when the side plates 7 are brought to cover the right and left openings 5B, and a depressing force transmitting abutment portion 74 extending from the upper edge portion 7A in the transverse direction so as to superimpose upon a respective one of the right and left lateral edges when the left and right side plate 7 are brought to cover the left and right openings 5B.

The retaining member 55 is disposed above and extends along the transverse direction, and is spaced from the rear edge of the upper wall 51 in an upright direction along the rear right or left lateral edge 53B, thereby defining a retaining groove 55A between the retaining member 55 and the upper wall 51.

The cover plate 6 is of a dimension to superimpose 10 on the upper wall 51, and has a front cover edge 6A, a rear cover edge 6B insertable into the retaining groove 55A in the longitudinal direction, and a pair of lateral cover edges 6C.

The depressing force actuating abutment portions 60 are disposed under and extend along the lateral cover edges 6C of the cover plate 6 to abut against the depressing force transmitting abutment portions 74 when the rear cover edge 6B is inserted into the retaining groove 55A so as to superimpose the cover plate 6 upon the upper wall 51.

The biasing members 62 are disposed to bias the rear cover edge 6B toward the retaining member 55 when the rear cover edge 6B is inserted in the retaining groove 55A.

The locking member is disposed on the upper wall 51 at a position distal to the rear edge 51A of the upper wall 51 to engage the depressing force actuating abutment portions 60 when the cover plate 6 is superimposed upon the upper wall 51.

In this embodiment, the locking member includes two rows of engaging hooks 54, each row being formed by punching on the upper wall 51 along a respective one of the right and left lateral edges 51B, and a plurality of peripheral notches 61 formed through the depressing force actuating abutment portions 60 to engage the engaging hooks 54 when the rear cover edge 6B is inserted into the retaining groove 55A.

The engagement means strengthen the engagement of the lateral abutment portions 70 of the sides plates 7 with the mounting seats 520 as the lateral abutment portions 70 are moved downward relative to the mounting seats 520 when the side plates 7 are brought to cover the right and left opening 5B.

In this embodiment, the strengthening engagement means includes two rows of aligned orifices 56 formed through each pair of the mounting seats 520 and extend in the upright direction, and two rows of engaging tabs 71 formed on the front and rear lateral abutment portions 70 of the side plates 7 to correspond with the orifices 56.

During the assembly, the lateral abutment portions 70 of the side plates 7 are brought to abut, via the engagement strengthening means, against the mounting seats 520 and are moved in the upright direction relative to the mounting seats 520. The subsequent insertion of the rear cover edge 6B of the cover plate 6 into the retaining groove 55A against action of the biasing members 62, and in cooperation with locking action of the locking member upon abutment of the depressing force actuating abutment portions 60 against the depressing force transmitting abutment portion 74, will urge the depressing force transmitting abutment portions 74 as well as the lateral abutment portions 70 downward so as to further secure the engagement accomplished by the engagement strengthening means.

Note that in the preferred embodiment, each of the main body 5, the right and left side plates 7 and the cover plate 6 is of a one-piece structure. Each of the biasing members 62 is a spring tongue formed by punching the cover plate 6 proximate to the rear cover edge 6B, and has a length in the upright direction greater than that of the retaining groove 55A.

Figure 5:
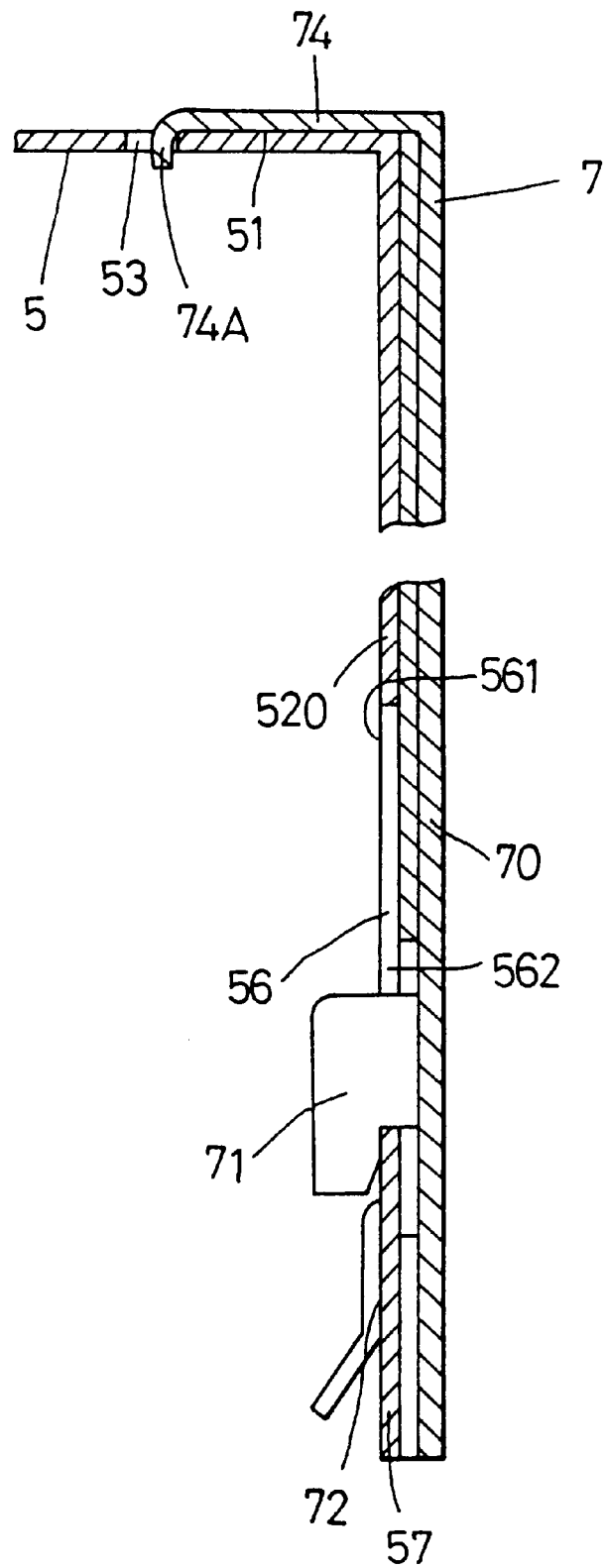
FIG. 5 illustrates how a side plate is mounted on a hollow main body of the preferred embodiment.
Figure 6:
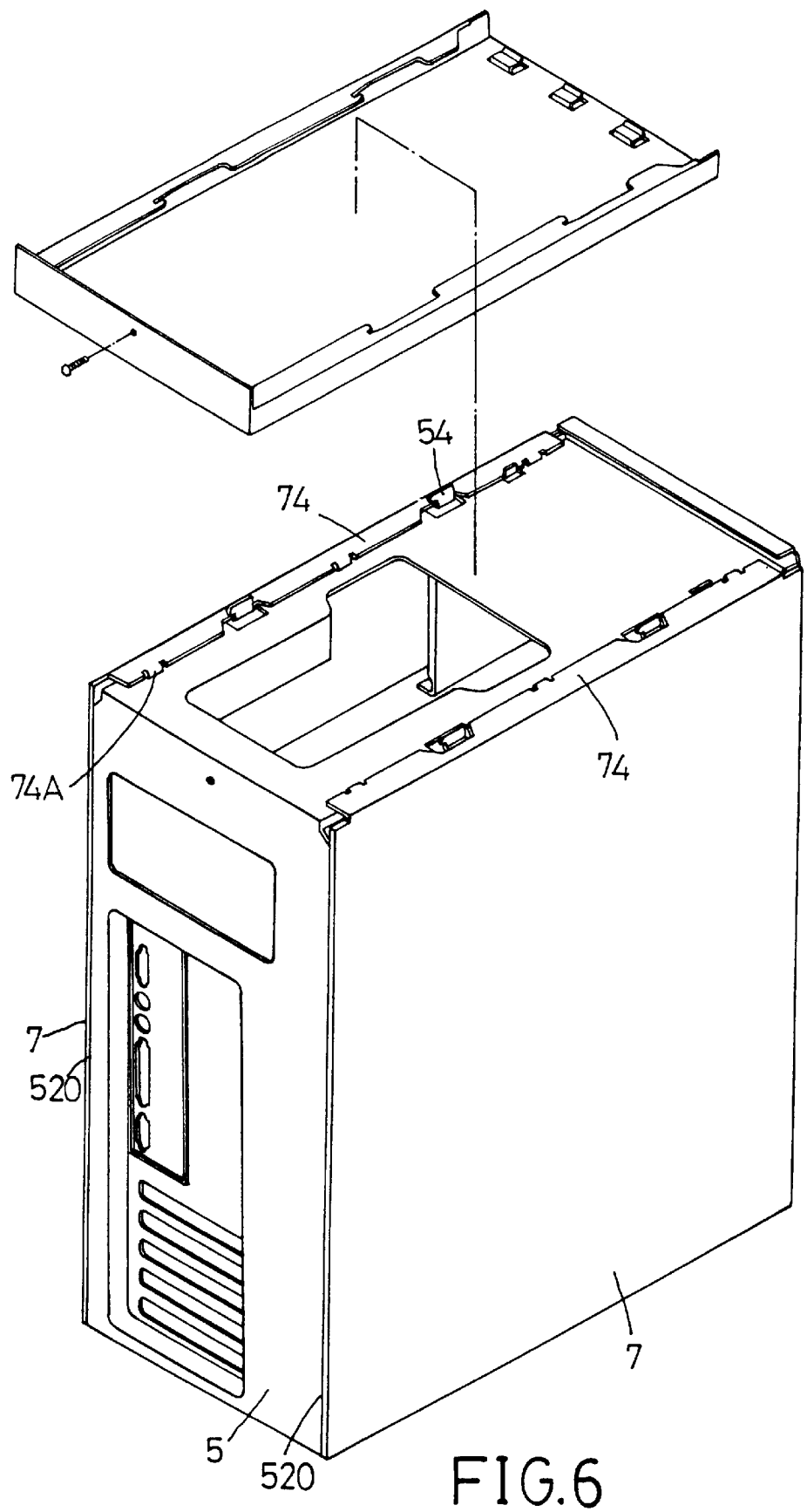
FIG. 6 illustrates a perspective view of the preferred embodiment, wherein a cover plate is removed to show how the side plates are mounted on the main body.

As best shown in FIGS. 5 and 6, each of the orifices 56 has an enlarged upper section 561 to facilitate insertion of a respective one of the engaging tabs 71 when the side plates 7 are brought to cover the right and left openings 5B, and a narrow lower section 562 into which the respective engaging tab 71 extends to further strengthen the engagement between the side plates 7 and the mounting seats 520 upon depression of the depressing force actuating abutment portions 60 on the depressing force transmitting abutment portions 74 when the rear cover edge 6B is inserted into the retaining groove 55A. The upper wall 51 further has two rows of engaging holes 53 formed therethrough along the right and left lateral edges 51B. The depressing force transmitting abutment portions 74 are formed with a plurality of downward positioning tabs 74A for extension into the engaging holes 53 when the side plates 7 cover the right and left openings 5B. Thus, no locking screws are employed in the mounting of the side plates 7 so as to cover the right and left openings 5B (see FIG. 4).

The main body 5 of the preferred embodiment is further provided with an extra pair of mounting seats 57 (see FIG. 4) which are formed along right and left lateral edges of the bottom wall 52 and which extend in the longitudinal direction. The lower edge 7B of each of the side plates 7 is formed with a plurality of engaging studs 72 which engage the mounting seats 57 to further strengthen the engagement between the side plates 7 and the main body 5 upon pressing of the depressing force actuating abutment portions 60 on the depressing force transmitting abutment portions 74 when the rear cover edge 6B is inserted into the retaining groove 55A.

With this invention thus explained, it is apparent that numerous modifications and variations can be made without departing from the scope and spirit of this invention. It is therefore intended that this invention be limited only as indicated in the appended claims.

I claim:

1. A casing comprising:
   a rectangular hollow main body having
      elongate upper and bottom walls spaced from each other, each of said upper and bottom walls having front and rear edges which define a transverse direction therealong, and right and left lateral edges which define a longitudinal direction therealong; and
      front and rear upright walls interposed between said upper and bottom walls and joined with said front and rear edges of said upper and bottom walls, respectively, said front and rear upright walls having front right and left lateral edges and rear right and left lateral edges, respectively, said front right and left lateral edges, said rear right and left lateral edges and said right and left lateral edges of said upper and bottom walls cooperatively defining right and left openings;
   two pairs of mounting seats joined with a first set of said front and rear left lateral edges and a second set of said front and rear right lateral edges, respectively, each pair of said mounting seats being disposed inboard to and extending from the respective one of said sets of front and rear lateral edges in said longitudinal direction;
   right and left side plates being of a dimension to cover said right and left openings, respectively, each of said right and left side plates having upper and lower edges and front and rear lateral abutment portions disposed to abut against a corresponding pair of said mounting seats when said side plates are brought to cover said left and right openings, and a depressing force transmitting abutment portion extending from said upper edge of a respective one of said right and left side plates in said transverse direction so as to superimpose upon a respective one of said right and left lateral edges when said left and right side plates are brought to cover said left and right openings;
   a retaining member disposed above and extending along said transverse direction and spaced from said rear edge of said upper wall to define a retaining groove therebetween in an upright direction along said rear right and left lateral edges;
   a cover plate being of a dimension to superimpose on said upper wall, and having a front cover edge, a rear cover edge insertable into said retaining groove in said longitudinal direction, and a pair of lateral cover edges;
   a pair of depressing force actuating abutment portions disposed under and extending along said lateral cover edges to abut against said depressing force transmitting abutment portions when said rear cover edge is inserted into said retaining groove so as to superimpose said cover plate upon said upper wall;
   a biasing member disposed to bias said rear cover edge toward said retaining member when said rear cover edge is inserted in said retaining groove;
   a locking member disposed on said upper wall at a position distal to said rear edge to engage said depressing force actuating abutment portions when said cover plate is superimposed upon said upper wall; and
   means for strengthening engagement of said lateral abutment portions of said sides plates with said pairs of mounting seats as said lateral abutment portions are moved downward relative to said mounting seats when said side plates are brought to cover said right and left openings;
   whereby, during assembly, said lateral abutment portions of said side plates are brought to abut, via said engagement strengthening means, against said mounting seats and are moved in the upright direction relative to said mounting seats, subsequent insertion of said rear cover edge of said cover plate into said retaining groove against action of said biasing member, in cooperation with locking action of said locking member upon abutment of said depressing force actuating abutment portions against said depressing force transmitting abutment portions, will urge said depressing force transmitting abutment portions as well as said lateral abutment portions downward so as to further secure engagement accomplished by said engagement strengthening means.

2. The casing as defined in claim 1, wherein each of said main body, said right and left side plates and said cover plate is of a one-piece structure.

3. The casing as defined in claim 2, wherein said biasing member is a spring tongue fixed to a lower surface of said cover plate and proximate to said rear cover edge, and has a length in said upright direction greater than a distance defined between said retaining member and said upper wall.

4. The casing as defined in claim 3, wherein said spring tongue is formed by punching said cover plate proximate to said rear cover edge thereof.

5. The casing as defined in claim 2, wherein said locking member includes two rows of engaging hooks, each of said rows being formed on said upper wall along a respective one of said right and left lateral edges, and a plurality of peripheral notches formed through said depressing force actuating abutment portions to engage said engaging hooks when said rear cover edge is inserted into said retaining groove.

6. The casing as defined in claim 5, wherein each of said engaging hooks is formed by punching said upper wall along a respective one of said right and left lateral edges.

7. The casing as defined in claim 2, wherein said strengthening engagement means includes two rows of aligned orifices formed through each pair of said mounting seats and extending in said upright direction, and two rows of engaging tabs formed on said front and rear lateral abutment portions of said side plates, respectively, wherein each of said orifices having an enlarged upper section to facilitate insertion of a respective one of said engaging tabs when said side plates are brought to cover said right and left openings, and a narrow lower section into which the respective one of said engaging tabs extends.

8. The casing as defined in claim 2, wherein said upper wall further has two rows of engaging holes formed therethrough along said right and left lateral edges, said depressing force transmitting abutment portions being formed with a plurality of downward positioning tabs for extension into said engaging holes when said side plates cover said right and left openings.

* * * * *